US009875924B2

(12) United States Patent
Tsai et al.

(10) Patent No.: US 9,875,924 B2
(45) Date of Patent: Jan. 23, 2018

(54) SPRAY COATER AND RING-SHAPED STRUCTURE THEREOF

(71) Applicant: XINTEC INC., Taoyuan (TW)

(72) Inventors: Tsou-Tso Tsai, Taipei (TW);
Kuo-Ching Wu, Hsinchu (TW);
Tzung-Heng Tsai, New Taipei (TW)

(73) Assignee: XINTEC INC., Taoyuan (TW)

( * ) Notice: Subject to any disclaimer, the term of this patent is extended or adjusted under 35 U.S.C. 154(b) by 44 days.

(21) Appl. No.: 15/053,521

(22) Filed: Feb. 25, 2016

(65) Prior Publication Data
US 2016/0250656 A1 Sep. 1, 2016

Related U.S. Application Data

(60) Provisional application No. 62/121,959, filed on Feb. 27, 2015.

(51) Int. Cl.
*B05C 13/02* (2006.01)
*B05C 11/02* (2006.01)
*H01L 21/683* (2006.01)
*H01L 21/67* (2006.01)

(52) U.S. Cl.
CPC ...... *H01L 21/6838* (2013.01); *H01L 21/6715* (2013.01)

(58) Field of Classification Search
USPC ............. 118/52, 612, 500, 503, 319, 320; 134/153, 198, 902; 396/604, 611, 627; 427/240
See application file for complete search history.

(56) References Cited

U.S. PATENT DOCUMENTS

| 6,176,931 B1* | 1/2001 | Restaino | C23C 14/50 118/500 |
| 6,916,126 B2* | 7/2005 | Lin | G03D 5/00 118/52 |
| 2012/0260946 A1* | 10/2012 | Ogata | H01L 21/67034 134/18 |

FOREIGN PATENT DOCUMENTS

TW 200630167 9/2006

* cited by examiner

*Primary Examiner* — Yewebdar T Tadesse
(74) *Attorney, Agent, or Firm* — Liu & Liu

(57) ABSTRACT

A spray coater is used to spray a photoresist on a front surface of a wafer. The spray coater includes a vacuum chuck, a flow guiding ring, and a positioning ring. The vacuum chuck has a top surface and a side surface adjacent to the top surface. The wafer is located on the top surface and protrudes from the top surface of the vacuum chuck. The flow guiding ring is disposed around the vacuum chuck and has a groove. The wafer protruding from the top surface covers the flow guiding ring, and an opening of the groove faces a back surface of the wafer opposite to the front surface. The positioning ring is disposed around the flow guiding ring, such that the flow guiding ring is between the positioning ring and the side surface of the vacuum chuck.

15 Claims, 3 Drawing Sheets

SPRAY COATER AND RING-SHAPED STRUCTURE THEREOF

RELATED APPLICATIONS

This application claims priority to U.S. provisional Application Ser. No. 62/121,959, filed Feb. 27, 2015, which is herein incorporated by reference.

BACKGROUND

Field of Invention

The present invention relates to a spray coater and a ring-shaped structure of the spray coater.

Description of Related Art

A typical spray coater includes a vacuum chuck, plural ring-shaped bodies and a nozzle. The ring-shaped bodies surround the vacuum chuck. When a wafer is located on the vacuum chuck, the nozzle can spray photoresist on a front surface of the wafer. In addition, redundant photoresist may flow to the ring-shaped bodies from the wafer. Thereafter, the redundant photoresist flows out of the spray coater from the ring-shaped bodies.

When the photoresist flows to an edge of the wafer from the front surface of the wafer, airflow generated by the vacuum chuck enables the photoresist to flow to a back surface of the wafer from the edge of the wafer, which is referred to as a "vacuum effect". Since the diameter of the wafer is about 10 mm greater than the outer diameter of the innermost ring-shaped body and the innermost ring-shaped body does not have a special design, the photoresist is left on the edge of the back surface of the wafer with a width of about 15 mm. As a result, the photoresist enters a trench of the wafer. In a subsequent manufacturing process, a knife is used to cut the wafer along the trench.

In a subsequent etching process, the photoresist left on the edge of the back surface of the wafer results in photoresist burning (PR burn), thus reducing the yield rate of the wafer. Moreover, the photoresist is also left on the vacuum chuck to cause abnormal vacuuming. In addition, the innermost ring-shaped body is made of aluminum, so that the strength of the innermost ring-shaped body is not enough and is easily deformed. As a result, the reliability of the spray coater is reduced.

SUMMARY

An aspect of the present invention is to provide a spray coater for spraying a photoresist on a front surface of a wafer.

According to an embodiment of the present invention, a spray coater includes a vacuum chuck, a flow guiding ring, and a positioning ring. The vacuum chuck has a top surface and a side surface that is adjacent to the top surface. The wafer is located on the top surface of the vacuum chuck, and at least a portion of the wafer protrudes from the top surface of the vacuum chuck. The flow guiding ring is disposed around the vacuum chuck and has a groove. The wafer protruding from the top surface covers the flow guiding ring. An opening of the groove faces a back surface of the wafer facing opposite to the front surface. The positioning ring is disposed around the flow guiding ring, such that the flow guiding ring is between the positioning ring and the side surface of the vacuum chuck.

In one embodiment of the present invention, an edge of the back surface of the wafer has a cutting trench, and the groove of the flow guiding ring is between the cutting trench and the side surface of the vacuum chuck.

In one embodiment of the present invention, an outer diameter of the flow guiding ring is smaller than a diameter of the wafer.

In one embodiment of the present invention, the outer diameter of the flow guiding ring is about 197.8 mm.

In one embodiment of the present invention, an inner diameter of the flow guiding ring is about 190.2 mm.

In one embodiment of the present invention, a distance that the wafer protrudes from the groove of the flow guiding ring is in a range from about 1 mm to 2 mm.

In one embodiment of the present invention, the groove of the flow guiding ring has a first oblique surface and a second oblique surface, and an acute angle is formed between the first oblique surface and the second oblique surface.

In one embodiment of the present invention, the flow guiding ring is made of a material including titanium.

In one embodiment of the present invention, a direction of the opening of the groove of the flow guiding ring is perpendicular to a radial direction of the vacuum chuck.

In one embodiment of the present invention, the spray coater further includes a holder, an outer ring, and a metal ring. The vacuum chuck protrudes from the holder. The outer ring is located on the holder and is between the holder and the positioning ring. The metal ring is located on the holder and surrounds the outer ring and the positioning ring.

In one embodiment of the present invention, the spray coater further includes a nozzle. The nozzle is movably located above the top surface of the vacuum chuck.

Another aspect of the present invention is to provide a ring-shaped structure installed in a spray coater that has a vacuum chuck.

According to an embodiment of the present invention, the ring-shaped structure includes a flow guiding ring and a positioning ring. The flow guiding ring is disposed around the vacuum chuck and has a groove. The wafer protruding from the vacuum chuck covers the flow guiding ring, and an opening of the groove faces a back surface of the wafer. The positioning ring is disposed around the flow guiding ring, such that the flow guiding ring is between the positioning ring and a side surface of the vacuum chuck.

In the aforementioned embodiments of the present invention, the flow guiding ring has the groove, and the opening of the groove faces the back surface of the wafer. When the vacuum chuck withdraws gas to flow the photoresist to the back surface of the wafer from the edge of the wafer, the redundant photoresist may flow into the groove. Hence, the amount of the photoresist attached to the back surface of the wafer can be reduced. As a result, the spray coater can prevent the photoresist from being burned (PR burn) on the edge of the back surface of the wafer in a subsequent etching process, thereby improving the yield of the wafer. In addition, since the groove of the flow guiding ring may accommodate the photoresist, the photoresist left on the top surface of the vacuum chuck is also reduced, and thus the probability of abnormal vacuuming in the vacuum chuck may be reduced.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
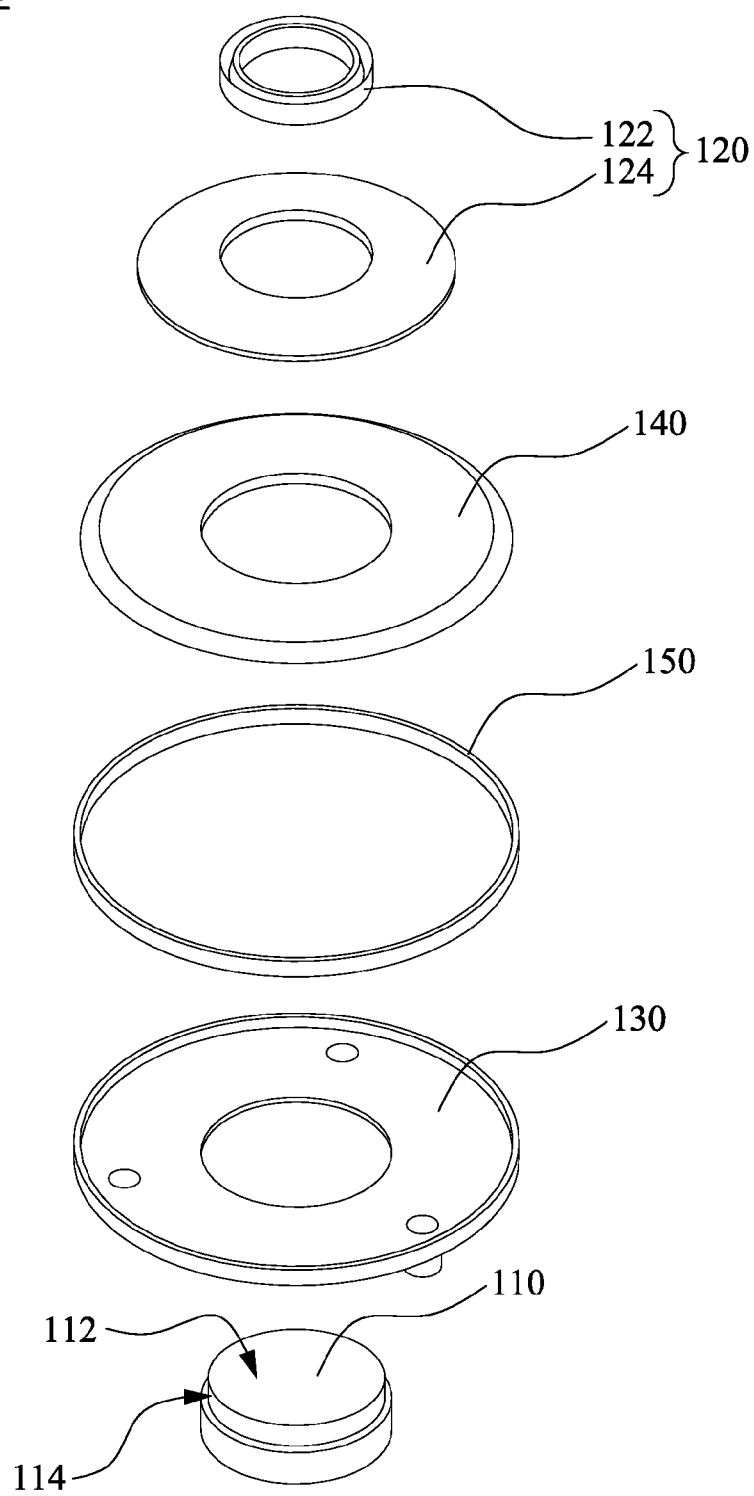
FIG. 1 is an exploded view of a spray coater according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
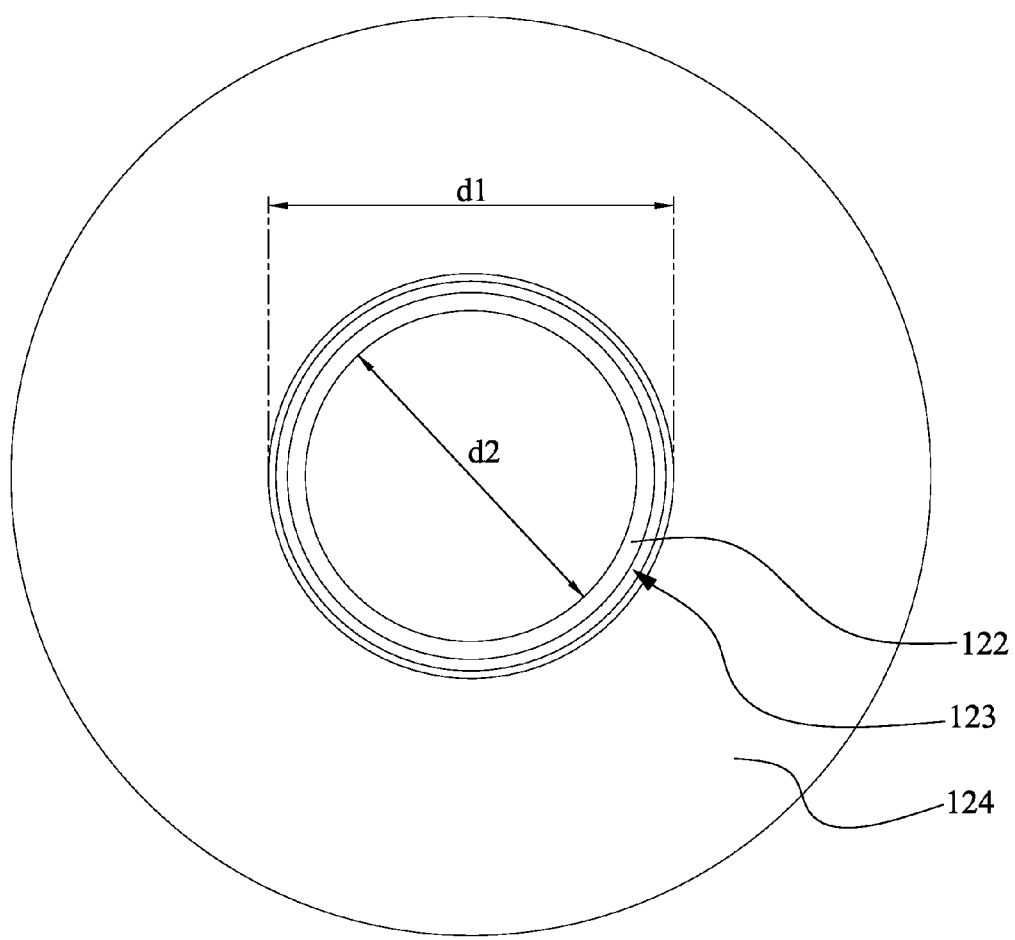
FIG. 2 is a top view of a ring-shaped structure formed by assembling a flow guiding ring and a positioning ring shown in FIG. 1.

FIG. 1 is an exploded view of a spray coater 100 according to one embodiment of the present invention. FIG. 2 is a top view of a ring-shaped structure 120 formed by assembling a flow guiding ring 122 and a positioning ring 124 shown in FIG. 1. As shown in FIG. 1 and FIG. 2, the spray coater 100 includes a vacuum chuck 110 and the ring-shaped structure 120. The ring-shaped structure 120 includes the flow guiding ring 122 and the positioning ring 124. The vacuum chuck 110 has a top surface 112 and a side surface 114 that is adjacent to the top surface 112. The flow guiding ring 122 has a groove 123, and the positioning ring 124 is disposed around the flow guiding ring 122. In addition, the spray coater 100 may further include a holder 130, an outer ring 140, and a metal ring 150.

In this embodiment, the vacuum chuck 110 have a function of withdrawing gas. When the vacuum chuck 110 supports a wafer, the wafer may be positioned on the top surface 112 of the vacuum chuck 110 by vacuuming. The spray coater 100 may further include the holder 130, the outer ring 140, and the metal ring 150, but the present invention is not limited in this regard.

Figure 3:
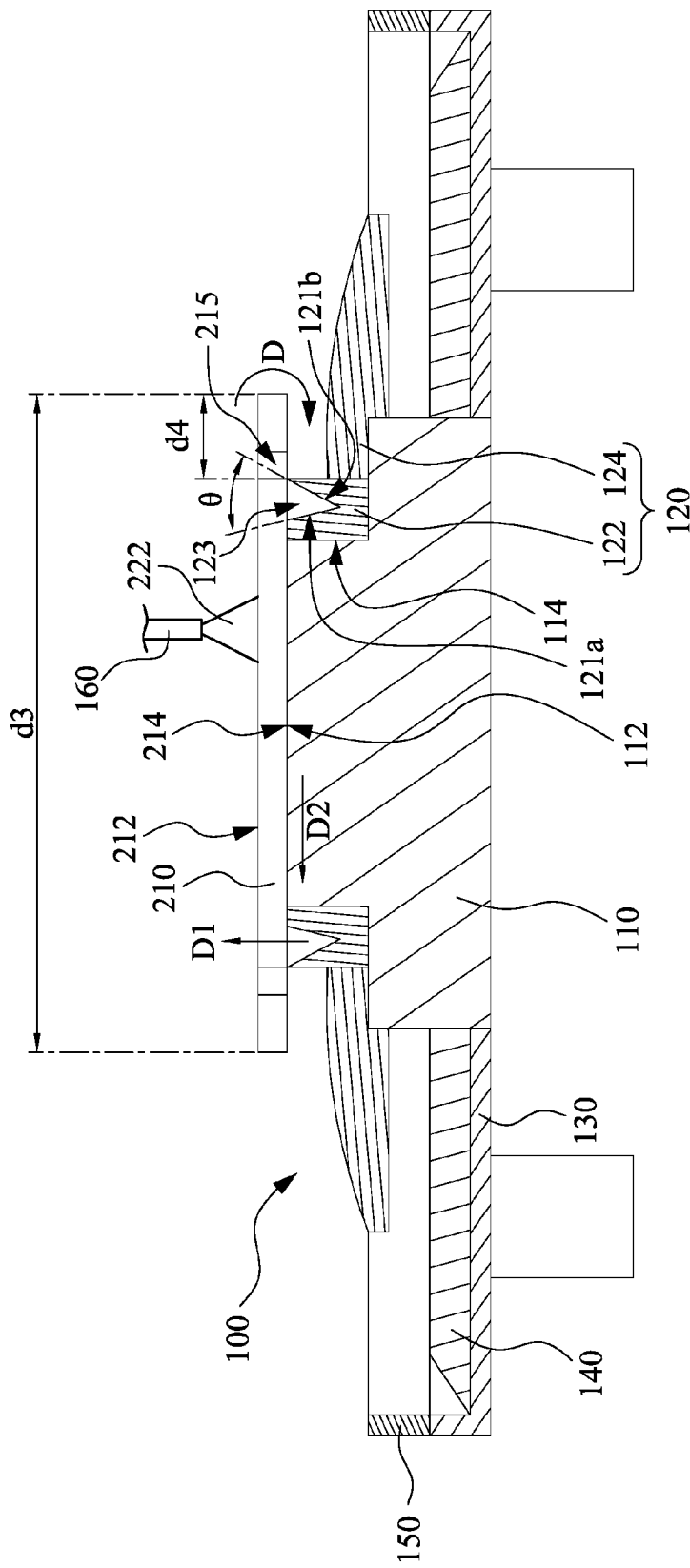
FIG. 3 is a schematic cross-sectional view of the spray coater shown in FIG. 1 when being operated.

FIG. 3 is a schematic cross-sectional view of the spray coater 100 shown in FIG. 1 when being operated. As shown in FIG. 3, a wafer 210 has a front surface 212 and a back surface 214 that is opposite to the front surface 212. The wafer 210 may be made of a material including silicon, and is a semiconductor element. When a spray coating process is performed on the wafer 210, the spray coater 100 can spray photoresist 222 on the front surface 212 of the wafer 210. The wafer 210 is located on the top surface 112 of the vacuum chuck 110, and can be attached by the vacuum chuck 110. At least a portion of the wafer 210, such as an edge of the wafer 210, protrudes from the top surface 112 of the vacuum chuck 110. The flow guiding ring 122 is disposed around the vacuum chuck 110. The wafer 210 protruding from the top surface 112 of the vacuum chuck 110 covers the flow guiding ring 122, and the opening of the groove 123 of the low guiding ring 122 faces the back surface 214 of the wafer 210. The positioning ring 124 is disposed around the flow guiding ring 122, such that the flow guiding ring 122 is located between the positioning ring 124 and the side surface 114 of the vacuum chuck 110.

The spray coater 100 further includes a nozzle 160. The nozzle 160 is movably located above the top surface 112 of the vacuum chuck 110. The nozzle 160 can spray gas (e.g., nitrogen) and the photoresist 222 on the front surface 212 of the wafer 210. Since the nozzle 160 injects gas and the vacuum chuck 110 withdraw gas, the photoresist 222 flows to the edge of the wafer 210 from the front surface 212 of the wafer 210 due to a vacuum effect. Thereafter, the photoresist 222 flows to the back surface 214 of the wafer 210 from the edge of the wafer 210. In other words, the photoresist 222 flows in a direction D.

However, the flow guiding ring 122 has the groove 123, and redundant photoresist 222 may flow into the groove 123 from the edge of the back surface 214 of the wafer 210. Hence, the amount of the photoresist 222 that is attached to the back surface 214 of the wafer 210 can be reduced. As a result, the spray coater 100 can prevent the photoresist 222 from being burned (PR burn) on the edge of the back surface 214 of the wafer 210 in a subsequent etching process, thereby improving the yield rate of the wafer 210. Moreover, since the groove 123 of the flow guiding ring 122 may accommodate the photoresist 222, the photoresist 222 left on the top surface 112 of the vacuum chuck 110 is also reduced, and the probability of abnormal vacuuming in the vacuum chuck 110 is reduced.

Since the flow guiding ring 122 of the spray coater 100 has the groove 123 to accommodate the photoresist 222, the cleaning time and frequency of the spray coater 100 may be reduced, and the production capacity of the spray coater 100 can further be improved. The flow guiding ring 122 may be made of a material including titanium which has high strength and is not easily deformed, thereby facilitating the reliability of the spray coater 100.

In this embodiment, the groove 123 of the flow guiding ring 122 has a first oblique surface 121a and a second oblique surface 121b, in which an acute angle θ is formed between the first and second oblique surfaces 121a, 121b, such that the groove 123 is a triangular groove, but the present invention is not limited in this regard. Furthermore, the direction D1 of the opening of the groove 123 of the flow guiding ring 122 is perpendicular to the radial direction D2 of the vacuum chuck 110.

As shown in FIG. 2 and FIG. 3, in this embodiment, the outer diameter d1 of the flow guiding ring 122 is about 197.88 mm, and the inner diameter d2 of the flow guiding ring is about 190.2 mm. The term "about" used herein means that there may be differences as a result of manufacturing errors, such as an error within 10%. The diameter d3 of the wafer 210 is about 200 mm. Since the outer diameter d1 of the flow guiding ring 122 is smaller than the diameter d3 of the wafer 210, the wafer 210 protrudes from the flow guiding ring 122 and covers the flow guiding ring 122. The wafer 210 protrudes from the groove 123 of the flow guiding ring 122 by a distance d4 which is in a range from about 1 mm to about 2 mm. The distance d4 may be considered as a range of the back surface 214 of the wafer 210 within which the photoresist 222 is attached back.

In this embodiment, the edge of the back surface 214 of the wafer 210 has a cutting trench 215, and the groove 123 of the flow guiding ring 122 is located between the cutting trench 215 and the side surface 114 of the vacuum chuck 110. In a subsequent manufacturing process, the cutting trench 215 may be used as a cutting position of the wafer 210 for a knife. The groove 123 of the flow guiding ring 122 may accommodate the photoresist 222 that flows to the back surface 214 of the wafer 210, thereby preventing a large amount of the photoresist 222 from flowing into the cutting trench 215 of the wafer 210.

In addition, the spray coater 100 may further include the holder 130, the outer ring 140, and the metal ring 150, but the present invention is not limited in this regard. The vacuum chuck 110 protrudes from the holder 130. The outer ring 140 is located on the holder 130 and is between the holder 130 and the positioning ring 124. The metal ring 150 is located on the holder 130 and surrounds the outer ring 140 and the positioning ring 124.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A spray coater for spraying photoresist on a front surface of a wafer, wherein the spray coater comprises:
    a vacuum chuck having a top surface and a side surface adjacent to the top surface, wherein the wafer is located on the top surface of the vacuum chuck, and at least a portion of the wafer protrudes from the top surface of the vacuum chuck;
    a flow guiding ring disposed around the vacuum chuck and having a groove, wherein the wafer protruding from the top surface covers the flow guiding ring, and an opening of the groove faces a back surface of the wafer opposite to the front surface, and wherein the groove of the flow guiding ring has a first oblique surface and a second oblique surface, and an acute angle is formed between the first oblique surface and the second oblique surface; and
    a positioning ring disposed around the flow guiding ring, thereby enabling the flow guiding ring to be located between the positioning ring and the side surface of the vacuum chuck.

2. The spray coater of claim 1, wherein an edge of the back surface of the wafer has a cutting trench, and the groove of the flow guiding ring is located between the cutting trench and the side surface of the vacuum chuck.

3. The spray coater of claim 1, wherein an outer diameter of the flow guiding ring is smaller than a diameter of the wafer.

4. The spray coater of claim 1, wherein the outer diameter of the flow guiding ring is about 197.8 mm.

5. The spray coater of claim 1, wherein an inner diameter of the flow guiding ring is about 190.2 mm.

6. The spray coater of claim 1, wherein the wafer protrudes from the groove of the flow guiding ring by a distance which is in a range substantially from 1 mm to 2 mm.

7. The spray coater of claim 1, wherein the flow guiding ring is made of a material comprising titanium.

8. The spray coater of claim 1, wherein a direction of the opening of the groove of the flow guiding ring is perpendicular to a radial direction of the vacuum chuck.

9. The spray coater of claim 1, further comprising:
    a nozzle movably located above the top surface of the vacuum chuck.

10. A spray coater for spraying photoresist on a front surface of a wafer, wherein the spray coater comprises:
    a vacuum chuck having a top surface and a side surface adjacent to the top surface, wherein the wafer is located on the top surface of the vacuum chuck, and at least a portion of the wafer protrudes from the top surface of the vacuum chuck;
    a flow guiding ring disposed around the vacuum chuck and having a groove, wherein the wafer protruding from the top surface covers the flow guiding ring, and an opening of the groove faces a back surface of the wafer opposite to the front surface;
    a positioning ring disposed around the flow guiding ring, thereby enabling the flow guiding ring to be located between the positioning ring and the side surface of the vacuum chuck;
    a holder, wherein the vacuum chuck protrudes from the holder;
    an outer ring located on the holder and between the holder and the positioning ring; and
    a metal ring located on the holder and surrounding the outer ring and the positioning ring.

11. A ring-shaped structure installed in a spray coater that has a vacuum chuck, wherein the ring-shaped structure comprises:
    a flow guiding ring disposed around the vacuum chuck and having a groove, wherein a wafer protruding from the vacuum chuck covers the flow guiding ring, and an opening of the groove faces a back surface of the wafer, and wherein the groove of the flow guiding ring has a first oblique surface and a second oblique surface, and an acute angle is formed between the first oblique surface and the second oblique surface; and
    a positioning ring disposed around the flow guiding ring, thereby enabling the flow guiding ring to be located between the positioning ring and a side surface of the vacuum chuck.

12. The ring-shaped structure of claim 11, wherein the outer diameter of the flow guiding ring is about 197.8 mm.

13. The ring-shaped structure of claim 11, wherein an inner diameter of the flow guiding ring is about 190.2 mm.

14. The ring-shaped structure of claim 11, wherein the flow guiding ring is made of a material comprising titanium.

15. The ring-shaped structure of claim 11, wherein a direction of the opening of the groove of the flow guiding ring is perpendicular to a radial direction of the vacuum chuck.

* * * * *